(12) United States Patent
Litt et al.

(10) Patent No.: US 7,031,869 B2
(45) Date of Patent: Apr. 18, 2006

(54) METHOD AND APPARATUS FOR MANAGING TIMESTAMPS WHEN STORING DATA

(75) Inventors: Timothe Litt, Southborough, MA (US); Richard E. Kessler, Shrewsbury, MA (US); Thomas Hummel, Marlborough, MA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 617 days.

(21) Appl. No.: 10/034,462

(22) Filed: Dec. 28, 2001

(65) Prior Publication Data

US 2003/0126490 A1    Jul. 3, 2003

(51) Int. Cl.
*G06F 19/00*  (2006.01)
(52) U.S. Cl. ...................... 702/125; 711/100
(58) Field of Classification Search ............... 702/125, 702/75–78, 79, 176, 178, 182; 711/100, 711/167, 157; 712/26, 225
See application file for complete search history.

(56) References Cited

U.S. PATENT DOCUMENTS 6,321,331 B1 * 11/2001 Roy et al. .................. 712/244
6,611,901 B1 * 8/2003 Micka et al. ............... 711/162

FOREIGN PATENT DOCUMENTS

SE           517917        * 8/2002
WO     WO 02/077810       * 10/2002

OTHER PUBLICATIONS

Shobaki, Mohammed El, Sep. 2004, Uppsala University Department of Information Technology, MRTC Report 2004/120, pp. 78-79.*

* cited by examiner

*Primary Examiner*—Patrick Assouad
*Assistant Examiner*—Edward Raymond

(57) ABSTRACT

A system is disclosed in which an on-chip logic analyzer (OCLA) includes timestamp logic capable of providing clock cycle resolution of data entries using a relatively small number of bits. The timestamp logic includes a counter that is reset each time a store operation occurs. The counter counts the number of clock cycles since the previous store operation, and if enabled by the user, provides a binary signal to the memory that indicates the number of clock cycles since the previous store operation, which the memory stores with the state data. If the counter overflows before a store operation is requested, the timestamp logic may force a store operation so that the time between stores can be determined.

33 Claims, 3 Drawing Sheets

METHOD AND APPARATUS FOR MANAGING TIMESTAMPS WHEN STORING DATA

CROSS-REFERENCE TO RELATED APPLICATIONS

Method And Apparatus For Efficiently Implementing Trace And/Or Logic Analysis Mechanisms On A Processor Chip, Ser. No. 10/034,717, filed Dec. 28, 2001; An Efficient Word Recognizer For A Logic Analyzer, Ser. No. 10/034,227, filed Dec. 28, 2001; and Method And Apparatus For Implementing Loop Compression In A Program Counter Trace, Ser. No. 10/034,506, filed Dec. 28, 2001.

Each of these co-pending applications is expressly incorporated by reference herein.

STATEMENT REGARDING FEDERALLY SPONSORED RESEARCH OR DEVELOPMENT

Not applicable.

BACKGROUND OF THE INVENTION

1. Field of the Invention

The present invention relates generally to devices that receive and store data for purposes of analysis. More preferably, the present invention relates to a logic device which is capable of receiving test or state data, and which stores that data in a memory device. Still, more particularly, the invention relates to a logic analyzer, which is capable of storing data on-chip with a timestamp that indicates the timing of the saved data relative to other stored data.

2. Background of the Invention

Data in a computer system can be obtained in two basic ways. First, the data can be routed to a requesting device or an intended target as soon as the data is generated. Second, the data can be stored in memory, and then later retrieved by the requesting device or intended target. The ability to store data in memory increases the efficiency of computer systems because it permits devices to operate independently and to schedule the routing of data using predefined arbitration schemes. One potential downside to this storing and routing of data is that timing information regarding the generation of the data may be lost. While many applications are indifferent to the time when the data was generated, there are certain applications where the timing of data may be critical.

One example where the relative timing of data is critical is during a debug or test operation, when an integrated circuit and/or associated software are tested for efficiency and errors. In these operations, data stored in memory indicates the internal state of the integrated circuit and/or the address of fetched or executed software instructions. The relative timing of this saved data may be critical in reconstructing the operation of the circuit and/or software. Thus, in these and other similar applications, the normal paradigm of generating data, saving data, and retrieving data may cause valuable information regarding the timing of the data to be irretrievably lost.

The testing and debugging of complex integrated circuits normally is performed using expensive external logic analyzers that connect to the external terminals of the integrated circuit. To capture the timing of the data, these external logic analyzers are capable of adding a timestamp to each piece of data that is stored in memory. Because of the very high clock frequencies at which modern integrated circuits operate, these external logic analyzers require a very large timestamp field to identify the timing of the data with the requisite precision. Currently available logic analyzers may use 50 or more bits to encode the relevant timing information. The use of such a large number of bits (or wide value) to encode the timing information can be accomplished because these external logic analyzers usually have access to large memory systems.

The use of external logic analyzers to test and debug an integrated circuit (or group of circuits) suffers in several respects. First, the signals obtained from the external output terminals may require that internal state data be inferred. Second, routing the desired state to external terminals often requires more wiring, silicon, drivers, pads and power than is affordable. Attempts to do so can compromise the normal functioning of the chip. And costs escalate throughout the design, often impacting the micropackaging and system board as well as the die. Third, oftentimes the internal clock rate of the chip operates at a much higher rate than the external logic analyzers that receive and process the data. As an example, processor designs currently under development operate at clock speeds up to and exceeding 2.0 GHz. The fastest commercial logic analyzers are incapable of operating at GHz frequencies. Thus, either certain data must be ignored, or some other mechanism must be employed to capture the high-speed data being generated on the chip. The typical approach is to run the chip at a slower clock speed so the data can be captured by external test equipment. This solution, however, makes it more difficult to detect errors that may only occur when the chip is running at higher clock speeds. Some errors that occur at full clock speed will not exist when the clock speed is slowed to accommodate the off-chip logic analyzers.

As an alternative to sending data off-chip, attempts have been made to capture certain state data on chip, thereby reducing the problems encountered when interfacing slower speed test equipment with high-speed devices. In this approach, an on-chip logic analyzer (OCLA) is provided to acquire and store data on the chip itself In the past, to the extent that designers sought to incorporate memory onto the chip for debug and test purposes, dedicated memory devices (usually RAM) were used. The problem with this approach, however, is that it requires the allocation of a significant amount of chip space to incorporate such a dedicated memory device. While such a dedicated memory device may prove useful during the design and development phase of the chip, it adds little or nothing to the performance of the chip. Thus, the inclusion of dedicated memory space on the chip represents an opportunity cost, and means that functionality and/or performance is sacrificed. Consequently, the inclusion of memory for debug purposes is generally viewed as undesirable because of the attendant loss of performance and functionality that results. If a dedicated memory device is included on the chip, system designers normally require that such a memory be very small in size to minimize the performance and functionality repercussion. As the size of the dedicated memory becomes smaller, so too does the likelihood that sufficient relevant data will be captured to provide an adequate insight into the source of the error.

In assignee's co-pending application entitled Method And Apparatus For Efficiently Implementing Trace And/Or Logic Analysis Mechanisms On A Processor Chip, (Invention Disclosure P01-3848), the teachings of which are incorporated herein, the on-chip cache memory is used to store data from the on-chip logic analyzer. The use of the on-chip cache memory as a storage device for the in-chip logic analyzer permits the storage of a relatively large amount of state data on the chip as compared to previous designs. While the use of the on-chip cache memory greatly expands the amount of state data that can be stored on-chip, the extent of data that can be stored is not limitless. For a processor operating at 2 GHZ, the amount of data that can be stored in a 256 kbyte cache represents only a few microseconds of data. Consequently, if the OCLA stores all incoming internal state data in the cache, the cache would quickly overflow, and potentially relevant data would be overwritten, or ignored. Assignee's co-pending application entitled An Efficient Word Recognizer For A Logic Analyzer, (Invention Disclosure P01-3850) discloses a technique for starting and stopping the storage of internal state data based on user programmed conditions, which can be implemented in an on-chip logic analyzer without consuming a large amount of space or processing power.

The ability to start and stop the storage of state or test data is an extremely powerful tool to the debugger because it permits the most pertinent data to be saved for later analysis. The ability to start and stop data storage, however, has a potential downside. The downside is that the data entries may be stored in a non-linear and unpredictable fashion over a relatively large period of time. As noted in the beginning of this Background section, knowledge of the time relationship of the stored data may be critical to the debug process. To make sense of the stored data, information regarding the timing of the saved data is required. Because of the high clock frequencies of modern integrated circuit designs, very high-resolution, and thus very wide, timestamps are required. A processor with a 1 GHz clock frequency (which is relatively slow by today's standards) must have a 20-bit wide timestamp to provide cycle-by-cycle encoding of a 1 millisecond time span. The problem, in a nutshell, is that providing a high-resolution timestamp requires a large number of bits to encode. In instances where the data storage device is limited in size, the inclusion of timestamps may unduly cramp the amount of memory that can be used for storing test data.

It would be desirable if a timestamp system and technique could be developed which would permit the inclusion of relatively high-resolution timestamp information with the test data, without requiring the use of a large number of data bits to encode the timestamp. Such a technique would be extremely valuable to the debugger, because it would permit a greater quantity of data to be stored at clock frequencies, while still providing critical timing information. Despite the apparent advantages that such a system would offer, to date no such system has been introduced.

BRIEF SUMMARY OF THE INVENTION

The problems noted above are solved in large part by a timestamp system that can be selectively enabled by a user to store a high-resolution timestamp with data when timing information is critical. The system includes a high-resolution counter that counts the number of clock cycles since the last piece of data was stored in memory. Despite the high-resolution nature of the counter, the counter preferably is encoded in a relatively small (or narrow) number of bits n. If the counter reaches its maximum value, the counter will enter its maximum value in the timestamp, thereby indicating to the user that the timer timed out and the data entry is more than $2^n$ cycles later then the last saved entry. Alternatively, according to the preferred embodiment, the timestamp system can force a save operation when the counter reaches its maximum value, so that the number of cycles between stores to memory can be determined.

According to an exemplary embodiment, a timestamp counter counts the number of cycles since the last store operation. If enabled by a user programmable value, the output of the timestamp counter is encoded in a relatively small number of bits that and stored in memory together with state or test data. If the timestamp is not enabled, then those bits are available to identify other data conditions. The time stamp counter preferably comprises a counter that produces an n-bit timestamp output. The n-bit timestamp code can represent up to x ($2^n$=x) different clock cycles since the last store operation. If enabled by a user programmable value, the timestamp counter will force a store operation when the count reaches its maximum $2^n$ value. The timestamp counter then restarts its cycle count, as it does with any other store operation. Thus, the timestamp count will always accurately represent the number of clock cycles that occurred between each store operation. To assist in the correlation and debugging of the stored data, the data stored with a maximum timestamp value may be designated as invalid, thereby representing that any data stored with the maximum timestamp value was the result of a forced timestamp save operation.

These and other aspects of the present invention will become apparent upon reading the detailed description of the preferred embodiment and the appended claims.

BRIEF DESCRIPTION OF THE DRAWINGS

For a detailed description of the preferred embodiments of the invention, reference will now be made to the accompanying drawings in which.

NOTATIONS, NOMENCLATURE AND INTERPREATIONAL ISSUES

Figure 1:
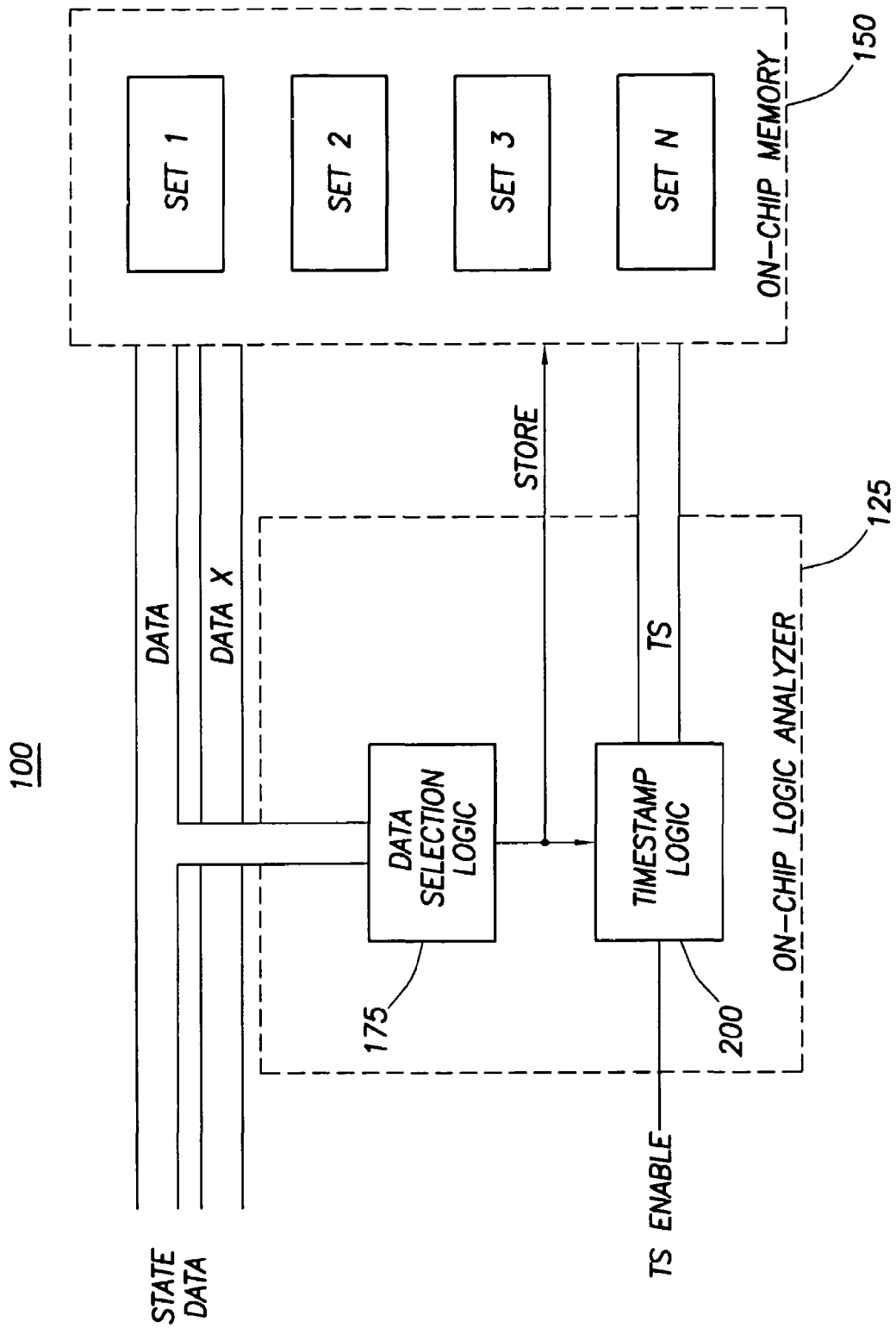
FIG. 1 shows an integrated circuit constructed in accordance with the preferred embodiment that includes an on-chip logic analyzer with timestamp logic, and an on-chip memory for storing internal state data together with a timestamp if enabled by the user.

Certain terms are used throughout the following description and claims to refer to particular system components. As one skilled in the art will appreciate, computer and microprocessor manufacturers and fabrication houses may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "connect", "connects", "couple" or "couples" is intended to mean either an indirect or direct connection. Thus, if a first device couples to a second device, that connection may be through a direct connection, or through an indirect connection via other devices and connections. Such connections are typically electrical, but may be via optical or other signaling methods. The terms "microprocessor" and "processor" are used interchangeably to refer to an integrated circuit that contains logic elements for manipulating data and for making decisions based on executable software. It should be understood that although the present invention is described in the context of the preferred embodiment, which is implemented as a processor, the present invention has broader application and can be used with any digital logic device that includes on-chip memory, and which must either be debugged or tested prior to release. Thus, the present invention and claims should not be limited to a microprocessor only, unless so specified expressly in the claims. It should also be understood that the present invention may be implemented in a single integrated circuit, or may be packaged in separate integrated circuits. Further, the following description describes the memory used for data storage as a set associative cache, with the cache regions directly mapping onto the plurality of cache sets comprising the cache. Since this is a common cache organization, the terms "set" and "cache set" are used herein to mean a single set of an n-way set associative cache, or such other cache region as may be convenient for a given embodiment. It should also be understood that there are multiple aspects to the invention disclosed herein, and that these aspects may independently merit patentability. Thus, if the claims do not expressly include a feature of the present invention, the intent is that any omitted features not form part of the claim, and that the claim instead focuses on some other aspect of the invention.

DETAILED DESCRIPTION OF THE PREFERRED EMBODIMENTS

In the following discussion, the present invention is described in the context of timestamp logic that is implemented as part of an on-chip logic analyzer which is included as part of an integrated circuit. It should be understood that the present invention can be used as part of any system where it is desirable to store timestamp information with data. Thus, the present invention is not intended to be limited to use with an on-chip logic analyzer, or for use in a single integrated circuit.

Referring initially to FIG. 1, the present invention constructed in accordance with the preferred embodiment generally comprises an integrated circuit 100 that includes an on-chip logic analyzer 125 coupled to an on-chip memory device 150. In accordance with the preferred embodiment, the on-chip memory device 150 comprises an on-chip cache memory, and the integrated circuit comprises a processor. Various other devices may reside on the processor, including without limitation a memory controller (not shown) that controls accesses to a system memory (not shown), an I/O interface (not shown), and various other logical devices that interface with other components normally implemented in a computer system. In addition, the processor may be designed to operate in a multiple processor environment, and thus may include one or more interfaces for coupling to other processors in a computer system.

In the exemplary embodiment depicted in FIG. 1, the on-chip memory 150 is segmented into a plurality of cache sets. N such cache sets are shown in FIG. 1 to indicate that the number of cache sets included in the cache memory 150 may vary as desired by the system designer. Each of the cache sets stores multiple lines of data, and each line of data comprises four doublewords, with each doubleword including 32 bits. Thus, each line in a cache set has 128 bits for storing data, plus any error checking and correction (ECC) bits. According to the preferred embodiment, one or more of the cache sets may be disabled and used exclusively by the on-chip logic analyzer 125 during periods when the integrated circuit 100 is in a debug mode. During other periods when the integrated circuit is functioning in a normal operational mode, the cache sets are all used by the core logic of the integrated circuit to maximize performance.

Thus, one or more of the cache sets may be selectively placed under the ownership of the on-chip logic analyzer. When the chip is placed in a debug mode, the disabled cache set stores internal state data selected by the on-chip logic analyzer 125, which subsequently can be retrieved by the user and analyzed as part of the debug process.

The on-chip logic analyzer (OCLA) 125 is specifically designed to facilitate the debugging of the processor both during the design and development phase, and during use in the field by customers. Thus, according to the preferred embodiment, the OCLA 125 includes logic for more efficiently debugging the chip hardware and any software that is executing on the processor. Although shown in the block diagram of FIG. 1 as being located within a single location, it should be understood that the logic for OCLA 125 (and other logic shown in FIG. 1) may be distributed throughout the chip.

Referring still to FIG. 1, the OCLA 125 preferably receives data regarding the state of various hardware devices and/or the address of software instructions being fetched and/or executed in the core logic of the integrated circuit 100. Thus, according to the preferred embodiment, the OCLA 125 may couple to various busses in the integrated circuit, and may also connect directly to certain logical devices within the integrated circuit to receive internal state data reflecting the operation of the core logic in the integrated circuit. In addition, the OCLA 125 may receive information relating to the operation of external devices or busses via external pins on the integrated circuit.

According to the preferred embodiment, the OCLA 125 preferably includes data selection logic 175 that is capable of filtering the state data it receives from the core logic in the integrated circuit, and of selecting the data to be stored in the on-chip memory device 150. The OCLA 125 may include various logical units that permit the OCLA 125 flexibility in filtering and selecting useful data, in a manner analogous to an external logic analyzer. When the data selection logic 175 determines that the internal state data should be stored, it asserts the STORE signal. Conversely, if the data selection logic 175 determines that state data should not be stored, it deasserts the STORE signal.

Referring still to FIG. 1 and according to the preferred embodiment of the present invention, the OCLA 125 also includes timestamp logic 200 that counts the number of clock cycles since the last store operation. The timestamp logic 200 produces an output signal TS representing a cycle count value that can be stored with each data entry in memory 15—to providing timing information relative to the stored state data. The timestamp logic 200 receives the STORE signal from the data selection logic 175, which causes the cycle count value to reset. In addition, the timestamp logic 200 preferably receives a timestamp enable (TS enable) signal and a timestamp force enable (TS Force) signal that controls the operation of the timestamp logic 200. These enable signals may be user programmed and stored in one or more control registers, as will be understood by one skilled in the art.

Figure 2:
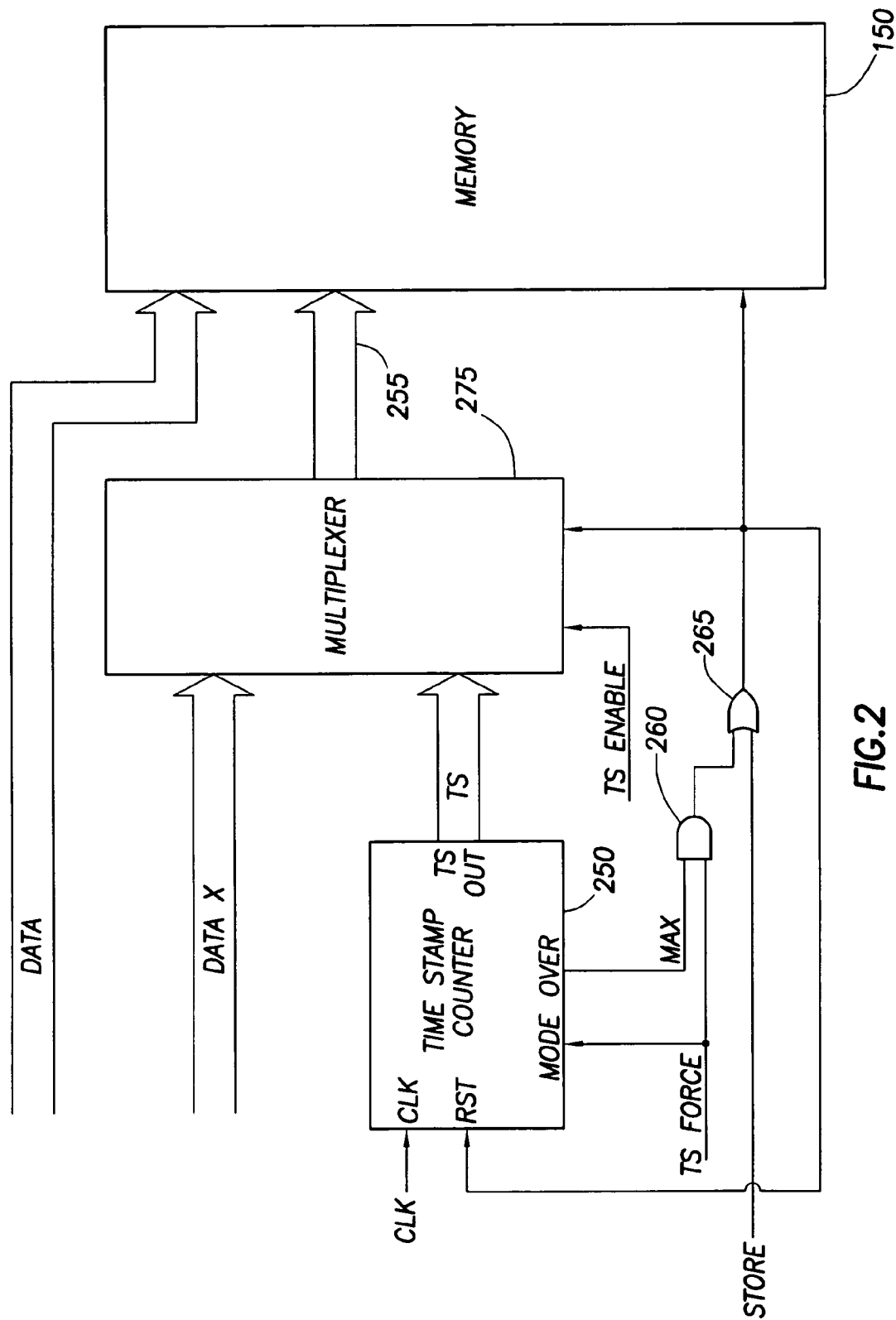
FIG. 2 is a block diagram of the timestamp logic of FIG. 1.

Referring now to FIG. 2, the timestamp logic 200 preferably includes a timestamp counter 250 and a multiplexer 275. It should be understood that other implementations are possible, and that the functionality of the timestamp counter 250 and multiplexer 275 may be combined. The timestamp counter 250 preferably comprises a digital counter that counts the number of clock cycles (CLK) appearing at its input terminal. Thus, as an example, the counter 250 increments or decrements on each rising edge of the clock signal. The timestamp counter 250 can be configured to count rising and/or falling clock edges, or some other aspect of the clock signal. The timestamp counter 250 encodes its count value on its TS output terminals, in accordance with any convention, thereby transmitting a timestamp (TS) output signal to multiplexer 275. The time stamp counter 250 preferably produces a relatively narrow n-bit timestamp output. The n-bit timestamp code can represent up to x ($2^n$=x) different clock cycles since the last store operation. If enabled by a user programmable value, the timestamp counter will force a store operation when the count reaches its maximum $2^n$ value. The timestamp counter then restarts its cycle count, as it does with any other store operation. Thus, the timestamp count will always accurately represent the number of clock cycles that occurred between each store operation. The number of bits n used to represent the timestamp value is arbitrary, but preferably is sufficiently wide to encode the typical time between store operations, but not wide enough to cover the maximum number of cycles that may occur.

The timestamp counter 250 also preferably includes an overflow output line, which is asserted when the count in the timestamp counter has reached its maximum value. The counter is described in the embodiment of FIG. 2 as a conventional binary counter, although it should be understood that other count sequences may be implemented without departing from the principles of the present invention. If, the counter is binary encoded, the overflow output signal (MAX) may also be obtained by AND'ing together the TS output terminals of the timestamp counter 250. The overflow output line (MAX) preferably couples to one terminal of an AND gate 260, while the other input of the AND gate 260 receives the TS Force enable signal. If the TS Force signal is enabled, and if the overflow output line (MAX) is asserted (indicating that the counter has reached its maximum count value), then the output terminal of AND gate 260 goes to a high voltage level. This, in turn, causes the OR gate 265 output to go high. The OR gate 265 also receives a STORE signal, indicating that the data selection logic 175 of the OCLA 125 (FIG. 1) requests that data be stored in the memory 150. The output of OR gate 265 will also go high if STORE is asserted. The output of OR gate 265 connects to the memory 150, and indicates to the memory that a store request has been made by the OCLA. Upon receipt of the STORE signal, the memory 150 will store the data appearing on the DATA bus and the data appearing on the multiplexer output bus 255. The data appearing on the DATA bus and MUX bus 255 are preferably stored on the same line in the memory 150. As an example, assuming a 64-bit line in the memory and a 7-bit timestamp, the data on the DATA bus may be stored in bits 0–56, while the data appearing on the MUX bus lines 255 are stored in bits 57–63.

The output of the OR gate 265 also feeds an input of the multiplexer 275. When the OR gate output goes high, the multiplexer 275 will drive out data on the MUX bus lines 255. If dedicated memory is used with the timestamp counter 250, then the multiplexer 275 may be omitted. The reset terminal of the timestamp clock also connects to the output terminal of OR gate 255. When the OR gate output goes high, the timestamp counter resets its count.

The multiplexer 275 receives the time stamp counter count value (TS), and also receives DATA X, indicating extra data relating to the internal state of the integrated circuit. The multiplexer 275 selects one of these values and places it on its output bus lines 255. The selection of whether to select the DATA X or TS data is determined by the TS enable signal, which preferably is user programmable. If the TS enable is asserted, the multiplexer 275 selects the timestamp count value to drive on the MUX bus 255. If TS enable is not asserted, then the multiplexer selects DATA X to drive on bus 255.

The count value encoded in the timestamp TS signal represents the number of clock cycles that have occurred since the last store operation. Each time a STORE signal is asserted, the counter 250 is reset. If no store operation is signaled before the counter 250 reaches it maximum value, the counter will produce the overflow signal (MAX). If the TS Force signal is enabled, the overflow signal will cause a store signal to be forced, and the current state data will be stored in memory 150. The counter 250 will also be reset, thereby restarting the count. If the TS FORCE signal is not enabled, the timestamp counter 250 will hold its maximum value on its TS output lines until the STORE signal is received.

Figure 3:
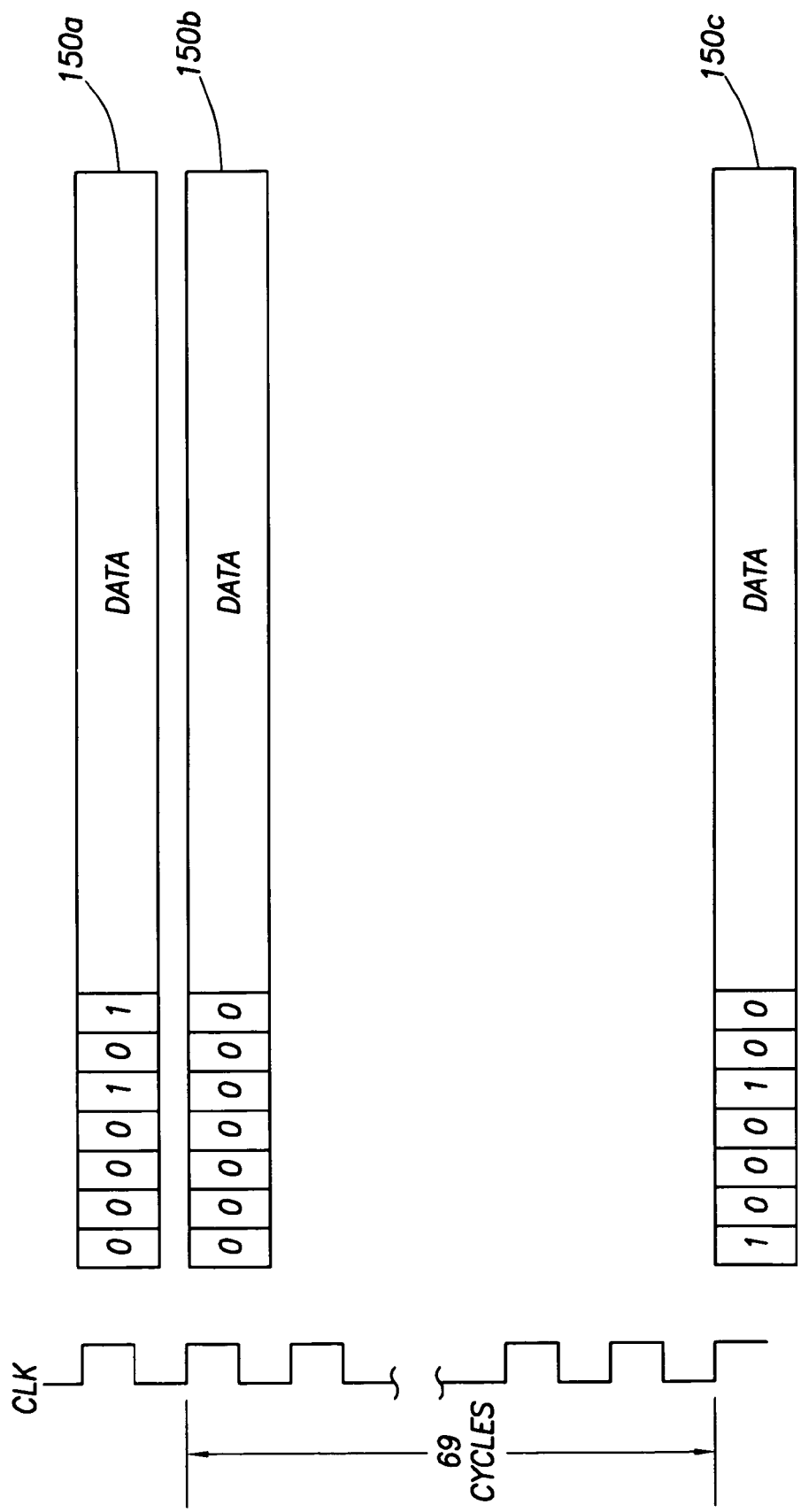
FIG. 3 illustrates the manner in which memory entries are timestamped to reflect clock cycles that occur between store operations.

The operation of the present invention will be illustrated with further reference to FIG. 3. FIG. 3 shows the data that is stored in three consecutive lines of memory 150a–c in response to three separate STORE signals from the data selection logic 175 of FIG. 1, with the TS signal enabled. In this example, seven data bits are used to encode the timestamp value. In the first data entry 150a, the timestamp bits (57–63) are encoded as 0000101, representing that 6 clock cycles were counted since the previous store operation. The next data entry 150b shows that a single clock cycle occurred since the previous store operation, as indicating by the value of 0000000 in bits (57–63). The third entry 150c shows a timestamp value of 1000100, indicating that 69 clock cycles were counted since the prior store operation. Thus, by examining bits 57–63 in this exemplary embodiment, the user can readily determine the number of clock cycles that occurred between data entries in the memory. It should be understood that the number of bits used for the timestamp, the order of the bits, the location of the bits, and the count sequence are all design variables, and are not intended to limit the scope of the present invention, unless specifically recited in the claims.

If the counter reaches its maximum value, an entry preferably is made in the next line of memory, whether or not any event or data is ready to be stored. According to the preferred embodiment, the maximum value is reserved to represent that the event data is invalid. Thus, to assist in the correlation and debugging of the stored data, the data stored with a maximum timestamp value is understood to be invalid, thereby representing that any data stored with the maximum timestamp value was the result of a forced timestamp save operation. If valid data did appear at the same time as the maximum timestamp count occurred, a value of zero preferably is stored in the next timestamp field. The use of this or a similar protocol insures an accurate timestamp value and data integrity.

Thus, by way of example, if a 7-bit counter is implemented, providing encoding of 128 bit values ($2^7$=128). The event data is valid when the timestamp value is less than 127. A timestamp of 126 thus indicates valid event data, 127 clock cycles after the previous entry. A count value of 127 indicates that the event data is invalid. The timestamp in the subsequent entry is 128+ the value stored in the timestamp bits, if the data is valid (that is, if the value stored is not 127 again).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit fabricated on a chip, comprising:
an on-chip logic analyzer including timestamp logic, said timestamp logic includes a timestamp counter that generates a timestamp count value signal indicating the number of clock cycles since a previous store operation;
an on-chip memory capable of storing data selected by said on-chip logic analyzer;
wherein the data stored by said on-chip memory is combined with a timestamp field representing the number of cycles since the previous store operation; and
wherein the on-chip logic analyzer generates a store signal when data is to be stored in the memory, and wherein the timestamp counter receives the store signal and resets the timestamp count value.

2. The system of claim 1, wherein the on-chip logic analyzer comprises data selection logic that selects data to be stored, and which generates the store signal.

3. The system of claim 1, wherein the timestamp count value signal is encoded in n bits which is stored as the timestamp field together with the stored data, thereby storing one of x timestamp codes with the stored data, where $x=2^n$.

4. The system of claim 3, wherein the number of valid timestamp count values y is less than the number of timestamp codes x.

5. The system of claim 3, wherein the number of bits n used to encode the timestamp count value is 8 or less.

6. The system of claim 3, wherein the number of bits n used to encode the timestamp count value comprises less than 20% of the available bits in each memory entry.

7. The system of claim 3, wherein the number of bits n used to encode the timestamp count value comprises less than 15% of the available bits in each memory entry.

8. The system of claim 3, wherein the number of bits n used to encode the timestamp count value comprises less than 12.5% of the available bits in each memory entry.

9. The system of claim 3, wherein the timestamp counter forces a store operation when the timestamp count value reaches a predetermined value.

10. The system of claim 9, wherein the timestamp counter generates the store signal when the timestamp count value reaches the predetermined value, and wherein said timestamp counter is reset in response.

11. The system of claim 10, wherein a timestamp value greater than the predetermined value represents that the data stored is invalid.

12. The system of claim 1, wherein the timestamp logic further includes a multiplexer coupled to said memory, and wherein said multiplexer receives the timestamp count value signal at one input terminal, and selects the timestamp count value signal for storing in said memory in response to the assertion of a timestamp enable signal.

13. The system of claim 12, wherein the multiplexer receives additional data bits at a second input terminal, and wherein said multiplexer selects the additional data bits for storing in said memory if said timestamp enable signal is de-asserted.

14. A system for storing timestamp information together with selected data, comprising:
a memory device with multiple entries capable of storing a bit field of a predetermined length;
data selection logic that monitors data, and which selectively stores data to said memory;
a timestamp counter coupled to said memory for supplying a timestamp value which can be selectively stored with said data in said memory;
wherein said timestamp value represents the number of clock cycles that have been counted by said timestamp counter since the previous entry was stored in said memory, and wherein said timestamp counter forces a store operation if the timestamp value reaches a predetermined value.

15. The system of claim 14, further comprising a multiplexer coupled to said memory, and wherein said multiplexer receives the timestamp value at one input terminal, and selects the timestamp count value signal for storing in said memory in response to the assertion of a timestamp enable signal.

16. The system of claim 15, wherein the data is stored in a bits in a memory entry, and the timestamp value is stored in x bits in memory, and wherein the number of data bits a stored in memory is substantially greater than the number of timestamp value bits n stored in memory.

17. The system of claim 15, wherein the multiplexer receives additional data bits of width n at a second input terminal, and wherein said multiplexer selects the additional data bits for storing in said memory if said timestamp enable signal is de-asserted.

18. The system of claim 17, wherein the timestamp counter comprises an n bit digital counter that is reset each time data is stored in said memory.

19. The system of claim 18, wherein the clock cycles occur at a frequency in excess of 1 GHz.

20. The system of claim 18, wherein the clock cycles occur at a frequency in excess of 800 MHz.

21. The system of claim 18, wherein the clock cycles occur at a frequency in excess of 600 MHz.

22. The system of claim 18, wherein the clock cycles occur at a frequency in excess of 400 MHz.

23. The system of claim 18, wherein the number of possible timestamp count values x, where $x=2^n-1$, is less than the number of cycles that may occur between store operations.

24. The system of claim 18, wherein the number of bits n used to encode the timestamp count value is 8 or less.

25. The system of claim 18, wherein the number of bits n used to encode the timestamp count value comprises less than 20% of the available bits in each memory entry.

26. The system of claim 18, wherein the number of bits n used to encode the timestamp count value comprises less than 15% of the available bits in each memory entry.

27. The system of claim 18, wherein the number of bits n used to encode the timestamp count value comprises less than 12.5% of the available bits in each memory entry.

28. The system of claim 18, wherein the timestamp counter, data selection logic, and memory are provided as part of an integrated circuit.

29. A processor fabricated on a chip, comprising:
an on-chip logic analyzer including a timestamp counter;
an on-chip memory capable of storing data selected by said on-chip logic analyzer, said memory having a width of z bits;
wherein said timestamp counter counts the number of clock cycles since the previous data storage, and generates a timestamp count value of n bits, which can be selectively stored with said data in said memory, and wherein said timestamp counter is capable of forcing storage of data when the timestamp count value reaches a predetermined value.

30. The processor of claim 29, wherein the selective storage of the timestamp count value in the memory is controlled by a timestamp enable signal.

31. The processor of claim 29, wherein the memory stores the n bits representing the timestamp count value, together with y bits of stored data, when the timestamp enable signal is asserted, and wherein the number of bits y equals z–n.

32. The processor of claim 31, wherein the memory stores w bits of data when the timestamp enable signal is not asserted, and wherein the number of bits w equals z.

33. The processor of claim 29, wherein the data that is stored when the timestamp counter reaches a value greater than the predetermined value is invalid.

* * * * *

UNITED STATES PATENT AND TRADEMARK OFFICE
CERTIFICATE OF CORRECTION

| | |
|---|---|
| PATENT NO. | : 7,031,869 B2 |
| APPLICATION NO. | : 10/034462 |
| DATED | : April 18, 2006 |
| INVENTOR(S) | : Timothe Litt et al. |

Page 1 of 1

It is certified that error appears in the above-identified patent and that said Letters Patent is hereby corrected as shown below:

In column 3, line 28, delete "modem" and insert -- modern --, therefor.

Signed and Sealed this

Fourteenth Day of July, 2009

JOHN DOLL
*Acting Director of the United States Patent and Trademark Office*